United States Patent
Li et al.

(10) Patent No.: US 11,696,488 B2
(45) Date of Patent: Jul. 4, 2023

(54) METHOD FOR ENHANCING STABILITY OF AGGREGATION STATE OF ORGANIC SEMICONDUCTOR FILM

(71) Applicant: Tianjin University, Tianjin (CN)

(72) Inventors: Liqiang Li, Tianjin (CN); Xiaosong Chen, Tianjin (CN); Jiannan Qi, Tianjin (CN); Wenping Hu, Tianjin (CN)

(73) Assignee: TIANJIN UNIVERSITY, Tianjin (CN)

( * ) Notice: Subject to any disclaimer, the term of this patent is extended or adjusted under 35 U.S.C. 154(b) by 0 days.

(21) Appl. No.: 17/994,349

(22) Filed: Nov. 27, 2022

(65) Prior Publication Data
US 2023/0103127 A1    Mar. 30, 2023

Related U.S. Application Data

(63) Continuation of application No. PCT/CN2022/074163, filed on Feb. 10, 2022.

(30) Foreign Application Priority Data

Sep. 23, 2021 (CN) .......................... 202111110113.3

(51) Int. Cl.
  *H01L 51/50* (2006.01)
  *H10K 71/30* (2023.01)
  (Continued)

(52) U.S. Cl.
  CPC .......... *H10K 71/30* (2023.02); *H10K 10/488* (2023.02); *H10K 10/84* (2023.02); *H10K 71/621* (2023.02);
  (Continued)

(58) Field of Classification Search
  CPC ..... H10K 71/30; H10K 71/621; H10K 85/113
  See application file for complete search history.

(56) References Cited

U.S. PATENT DOCUMENTS

2007/0298242 A1* 12/2007 Huo ....................... G02C 7/108
                                                                   428/323

FOREIGN PATENT DOCUMENTS

CN    101916825 A    12/2010
CN    102723437 A    10/2012
(Continued)

OTHER PUBLICATIONS

CNIPA, Notification to grant patent right for invention in CN202111110113.3, dated Nov. 8, 2021.
(Continued)

*Primary Examiner* — Anthony Ho
(74) *Attorney, Agent, or Firm* — Zhigang Ma

(57) ABSTRACT

A method for enhancing aggregation state stability of organic semiconductor (OSC) films includes constructing the OSC film; introducing uniform and discontinuous nanoparticles on a surface of the film or an inside of the film. Electrical properties of the OSC film are not influenced by introducing the nanoparticles. Grain boundary, dislocation, stacking fault, and surface of the film are pinned by the nanoparticles, increasing potential barrier of the aggregation state evolution of the film, and thus enhancing the stability of the aggregation state and greatly improving maximum working temperature and storage lifetime of organic field-effect transistors. Under room temperature storage, morphology of the OSC film introduced with the nanoparticles is difficult to change, so that the stability of electrical properties of organic transistor components prepared from the film is ensured in a high-temperature and atmospheric working environment.

7 Claims, 14 Drawing Sheets

(51) Int. Cl.
    *H10K 10/84*     (2023.01)
    *H10K 10/46*     (2023.01)
    *H10K 71/00*     (2023.01)
    *H10K 85/10*     (2023.01)
    *H10K 85/60*     (2023.01)

(52) U.S. Cl.
    CPC ....... *H10K 85/113* (2023.02); *H10K 85/6576* (2023.02)

(56) References Cited

FOREIGN PATENT DOCUMENTS

| | | |
|---|---|---|
| CN | 103682099 A | 3/2014 |
| CN | 104882541 A | 9/2015 |
| CN | 106953010 A | 7/2017 |
| CN | 108258116 A | 7/2018 |
| CN | 110767806 A | 2/2020 |
| JP | 2000058267 A | 2/2000 |
| WO | 2015177541 A1 | 11/2015 |

OTHER PUBLICATIONS

Tianjin University, originaly filed (allowed) claims for invention inCN202111110113.3, dated Sep. 23, 2021.

\* cited by examiner

METHOD FOR ENHANCING STABILITY OF AGGREGATION STATE OF ORGANIC SEMICONDUCTOR FILM

TECHNICAL FIELD

The disclosure relates to a field of organic semiconductor technology, and in particular to a method for enhancing stability of an aggregation state of an organic semiconductor film.

BACKGROUND

Organic semiconductor films have been applied in a series of new technologies in electronic field, such as flexible displays, sensors, radio frequency tags and wearable electronic devices because of intrinsic mechanical flexibility. Therefore, the organic semiconductor films have become core materials in next generation of the flexible electronic technology. After more than three decades of development, a mobility of the organic field-effect transistor prepared from the corresponding organic semiconductor film has now surpassed that of an amorphous silicon field-effect transistor. However, commercial products based on the organic field-effect transistors have not yet been realized, which is mainly resulted from a poor structural stability of the aggregation state of the organic semiconductor films. The organic semiconductor films will undergo morphological changes of dewetting under long-time storage and working in high temperature, which leads to a structural instability of the aggregation state of the organic semiconductor films, thus leading to degradation of electrical properties of the organic field-effect transistors or even complete failure. Main forms of the instability are destabilization of on-state current, drift of threshold voltage and decrease in the mobility. Therefore, it is necessary to improve the stability of the aggregation state of the organic semiconductor films to enable the organic transistors to have a promising commercial future.

The organic semiconductor films prepared by conventional methods such as vacuum thermal deposition method or solution method are usually polycrystalline, which has multiple defects, such as a large number of grain boundaries, dislocations, and stacking faults. Organic molecules at the defects are arranged irregularly and have higher energies. Compared with single crystals, morphologies of the internal polycrystalline are more likely to change, which adds additional residual stress to the films, and directly affects the stability of the aggregation state of the films. The organic semiconductor films are bonded with van der Waals forces and the forces inherently are weakly bonded. Therefore, compared with inorganic semiconductors that are bonded with covalent bonds, the organic semiconductors are more likely to release additional internal energy stored with the films driven by the stress, which in turn leads to changes in the structure of the aggregation state of the films. Even at room temperature, the aggregation state of the organic semiconductor films will also change, which is shown in an intrinsic instability of the aggregation state. Therefore, it is necessary to explore the instability mechanism of the aggregation state of the organic semiconductor films and develop effective methods to enhance the stability of the aggregation state of the organic semiconductor films for designing stable and commercially available organic field-effect transistors. At present, methods to improve the stability of the aggregation state of the semiconductor films include molecular design, encapsulation, low-temperature storage, and increasing film thickness. Although the above methods alleviate the morphological changes of the organic semiconductors films caused by the instability of the aggregation state, the above methods cannot effectively change the intrinsic instability of the aggregation state of the organic semiconductor films, and cannot fundamentally solve the failure of the components prepared from the organic semiconductor films.

SUMMARY

In view of the deficiencies of the prior art, the disclosure aims to provide a method for enhancing structural stability of an aggregation state of an organic semiconductor film. The method uses a dispersion strength strategy to increase potential barrier of structural change of the aggregation state of the organic semiconductor film by inhibiting molecular dispersion at the defects, thereby improving working temperature and storage lifetime of the organic semiconductor film.

In order to achieve the above objects, the disclosure provides technical solutions as follows.

The disclosure provides a method for enhancing stability of the aggregation state of the organic semiconductor film. The organic semiconductor film is constructed on a surface of an insulating substrate, then nanoparticles with high melting point are introduced into a surface of the organic semiconductor film or an inside the organic semiconductor film, and the introduced nanoparticles with high melting point are uniform, discontinuous, and with a trace amount. A volume fraction of the nanoparticles with high melting point accounts between 0.1% and 3% of a volume of the organic semiconductor film, and the nanoparticles with high melting point can be introduced into the surface of the organic semiconductor film or the inside the organic semiconductor film. In addition, a specific upper limit of doping volume depends on the volume fraction of the nanoparticles with different high melting point that affects intrinsic electrical properties, as long as the electrical properties of the organic semiconductor are not affected by the doping volume.

The introduction method of the nanoparticles with high melting point is thermal evaporation method, which is achieved by heating an evaporation source to enable the nanoparticles to reach an atomic-scale gaseous state from a solid state, nucleating again the surface of the nanoparticles in a certain rotation speed with a size in nanometer-scale, thereby obtaining introducing the nanoparticles with high melting point. The aggregation state of the organic semiconductor film is unstable, and the nanoparticles introduced in the above process are uniformly and discontinuously distributed on the surface or the inside of the organic semiconductor film, do not aggregate, do not affect the electrical properties of the organic semiconductor film, and are used for pinning the dislocation, the grain boundaries, the stacking faults, and the surfaces in the organic semiconductor film, thereby stabilizing the aggregation state of the organic semiconductor film, so that the organic electronic components prepared from the film can bear higher working temperature and be stored for a longer time.

In an illustrated embodiment of the disclosure, a rate of thermal evaporation is at a range from 0.01 Angstrom per second (Å/s) to 0.1 Å/s.

In the illustrated embodiment of the disclosure, a rate of rotation of the substrate is 5 revolutions per minute (rpm) when the nanoparticles are thermally evaporated.

In the illustrated embodiment of the disclosure, before constructing the organic semiconductor film, the method further includes preparing a gate conductive electrode. As long as the substrate and the insulating layer are currently available for commercial products or literature reported, then they can be used herein. In the illustrated embodiment of the disclosure, the substrate and the insulating layer are selected from flexible or hard materials to prepare the gate conductive electrode, and the gate electrode is electrically conductive. The commonly used Si++/SiO$_2$ substrate is a substrate that the heavily doped silicon (Si++) compounds with a silicon dioxide (SiO$_2$) insulating layer, such that the substrate has already been constructed with the insulating layer and the gate, therefore, there is no need to prepare the gate. And the above described substrate itself can be directly regarded as the substrate (only providing a support for materials). However, it can also re-prepare a gate electrode and an insulating layer by selecting another substrate.

In the illustrated embodiment of the disclosure, the method for constructing polycrystalline organic semiconductor film includes, but is not limited to, a thermal evaporation method, an atomic layer deposition method, an electron beam evaporation method, a magnetron sputtering method, a hydrogen arc plasma method, a laser evaporation method, an electroplating method, a spin coating method, a sol-gel method, a pulling method or an instillation method, etc.

In the illustrated embodiment of the disclosure, the polycrystalline organic semiconductor film is a polycrystalline film with a thickness between 1 nanometer (nm) and 1 micrometer (μm), and an illustrated range of the thickness is between 5 nm and 200 nm.

In the illustrated embodiment of the disclosure, the polycrystalline organic semiconductor film is an organic small-molecule semiconductor or an organic polymer semiconductor.

In the illustrated embodiment of the disclosure, the organic semiconductor includes, but is not limited to, the following small-molecule semiconductors: one of dinaphtho[2,3-b: 2',3'-f]thieno[3,2-b]thiophene (DNTT), 2,6-diphenylanthracene (DPA), N,N'-Bis(2,2,3,3,4,4,4-heptafluorobutyl)-3,4,9,10-perylene dicarboximide (PTCPI-CH$_2$C$_3$H$_7$), pentacene, N,N'-bis(2,2,3,3,4,4,4-heptafluorobutyl)-1,7-dicyano-perylene-(3,4:9,10)-tetracarboxylic diimide (N1100), 3,4,9,10-Perylenetetracarboxylic dianhydride (PTCDA) and N,N'-bis(n-octyl)-x:y, dicyanoperylene-3,4:9,10-bis(dicarboximide) (N1200).

The organic polymer semiconductor includes, but is not limited to, one of poly(3-hexylthiophene-2,5-diyl) (P3HT), poly[[1,2,3,6,7,8-hexahydro-2,7-bis(2-octyldodecyl)-1,3,6,8-dioxobenzo[1Mn][3,8]phenanthroline-4,9-diyl][2,2'-bithiophene]-5,5'-diyl] (N2200) and poly[thieno[3,2-b]thiophene-2,5-diyl(4,4'-ditetradecyl[2,2'-bithiophene]-5,5'-diyl)] (PBTTT-C14).

In the illustrated embodiment of the disclosure, a diameter of the nanoparticles is between 0.1 nm and 100 nm, and an illustrated range of the diameter is between 1 nm to 10 nm, of which thermal stability is better than that of the organic semiconductor film.

In the illustrated embodiment of the disclosure, the nanoparticle includes one of a metal conductor nanoparticle, an organic semiconductor nanoparticle, an inorganic semiconductor nanoparticle and an insulator nanoparticle. The method for introducing the nanoparticles includes, but is not limited to, the thermal evaporation method. The nanoparticles include, but are not limited to, the metal conductor nanoparticles, the semiconductor nanoparticles, and the semiconductor nanoparticles, and the metal conductor nanoparticles can be gold (Au), silver (Ag), aluminum (Al), copper (Cu), chromium (Cr), etc.; the semiconductor nanoparticles can be fullerene (Co); and the insulator particles can be molybdenum (MoO$_3$), tungsten trioxide (WO$_3$), aluminum oxide (Al$_2$O$_3$).

In the illustrated embodiment of the disclosure, the method further includes preparing a source electrode and a drain electrode by patterning. There are no requirements for shapes of the source electrode and the drain electrode and a distance between the two electrodes. The source electrode and the drain electrode can be prepared by the thermal evaporation method, the atomic layer deposition method, the electron beam evaporation method, the magnetron sputtering method, the electroplating method, the electrode transfer method, etc. and the electrodes are conductors. For example, the conductors can be metal electrodes and conductive polymers can also be used as the electrodes.

The method of the disclosure is suitable for enhancing the stability of the aggregation state of the components prepared by the organic semiconductor film, including but not limited to organic film transistors, organic heterojunction transistors, organic field-effect transistors, organic light emitting diodes, and organic solar cells.

Effects of the technical solutions of the disclosure are as follows.

Compared with an untreated DNTT field-effect transistor, the DNTT field-effect transistor obtained in the disclosure bears a higher working temperature and has a longer lifetime, and specifically displays in that the DNTT field-effect transistor obtained in the disclosure is heated at 210° C. for 30 minutes, heated at 240° C. for 5 minutes, and continuously works for 17 days at 150° C. According to accelerated aging tests at different temperatures, an Arrhenius lifetime prediction model for aging regulation of the organic field-effect transistor is proposed, and a theoretical lifetime of the organic field-effect transistor at room temperature is millions of years, which far exceeds the reported results and ensures stability of properties of the organic field-effect transistors under high temperature conditions or after being left for several years.

According to the method of the disclosure, introducing the nanoparticles to the surface or the inside of the organic semiconductor film can pin the grain boundary, dislocation, stacking fault, and surface of the organic semiconductor film, so that the aggregation state is stabilized by the nanoparticles. In addition, the increase in the potential barrier of the change of the aggregation state fundamentally suppresses the intrinsic instability of the aggregation state of the organic semiconductor, thereby substantially increasing the working temperature and the storage lifetime of the organic electronic components. Currently existing methods can only alleviate the instability of the aggregation state of the organic semiconductor, while the organic semiconductor film with introducing nanoparticles by the method in the disclosure has improved the stability of the aggregation state compared with the organic semiconductor film without introducing nanoparticles, as evidenced by (1) the tolerable working temperatures of different semiconductors being increased by 20° C. to 120° C.; (2) the morphology and electrical properties of the organic semiconductor film with introducing nanoparticles not significantly being changed after 6 years of storage. The above effects ensure the stability of the electrical properties of the organic electronic components prepared from the organic semiconductor film at high temperatures and in real environments.

BRIEF DESCRIPTION OF DRAWINGS

In order to explain technical schemes of embodiments of the disclosure more clearly, the following will briefly introduce attached drawings required in the embodiments. Apparently, the attached drawings in following descriptions are only some of the embodiments of the disclosure. For those skilled in the related art, other drawings can be obtained according to the attached drawings without creative effort.

FIG. 2A is a schematic diagram of a bottom-gate top-contact organic field-effect transistor; FIG. 2B is a schematic diagram of a bottom-gate bottom-contact organic field-effect transistor; FIG. 2C is a schematic diagram of a top-gate top-contact organic field-effect transistor; FIG. 2D is a schematic diagram of a top-gate bottom-contact organic field-effect transistor.

FIG. 3A is a schematic diagram of the morphology of DNTT film at room temperature; FIG. 3B is a schematic diagram of the morphology of the DNTT film after annealing at 210° C. for 30 minutes; FIG. 3C is a schematic diagram of the morphology of DNTT film doped with Au nanoparticles at room temperature; FIG. 3D is a schematic diagram of the morphology of the DNTT film doped with Au nanoparticles after annealing at 210° C. for 30 minutes; FIG. 3E is a schematic diagram of the morphology of DNTT film bulk phase-doped with Au nanoparticles at room temperature; FIG. 3F is a schematic diagram of the morphology of the DNTT film bulk phase-doped with Au nanoparticles after annealing at 210° C. for 30 minutes.

FIG. 6A is a schematic diagram of the morphology of the P3HT film at room temperature; FIG. 6B is a schematic diagram of the morphology of the P3HT film after annealing at 300° C. for 1 hour; FIG. 6C is a schematic diagram of the morphology of P3HT film doped with Au nanoparticles at room temperature; FIG. 6D is a schematic diagram of the morphology of the P3HT film doped with Au nanoparticles after annealing at 300° C. for 1 hour.

FIG. 7A is a schematic diagram of the morphology of DNTT film at room temperature; FIG. 7B is a schematic diagram of the morphology of the DNTT film after annealing at 210° C. for 30 minutes; FIG. 7C is a schematic diagram of the morphology of DNTT film bulk phase-doped with Au nanoparticles at room temperature; FIG. 7D is a schematic diagram of the morphology of the DNTT film bulk phase-doped with Au nanoparticles after annealing at 210° C. for 30 minutes.

FIG. 9A is a schematic diagram of the morphology of the DNTT organic semiconductor film doped with different nanoparticles at room temperature; FIG. 9B is a schematic diagram of the morphology of the DNTT organic semiconductor film doped with different nanoparticles after annealing at 220° C. for 30 minutes.

FIG. 10A is the transmission electron micrograph of DNTT organic semiconductor film doped with nanoparticles of 0.1% volume fraction; FIG. 10B is the transmission electron micrograph of DNTT organic semiconductor film doped with nanoparticles of 0.5% volume fraction; FIG. 10C is the transmission electron micrograph of DNTT organic semiconductor film doped with nanoparticles of 1.5% volume fraction; FIG. 10D is the transmission electron micrograph of DNTT organic semiconductor film doped with nanoparticles of 3% volume fraction.

DETAILED DESCRIPTION OF EMBODIMENTS

Figure 1:
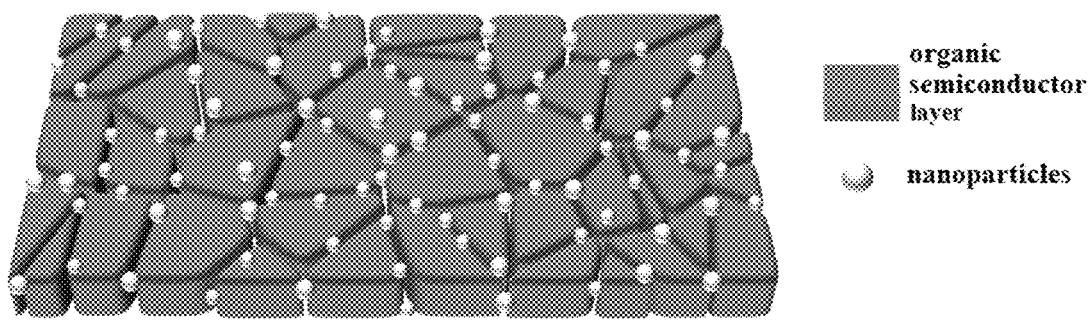
FIG. 1 is a schematic diagram of enhancing stability of an aggregation state of an organic semiconductor film by introducing nanoparticles according to a method of the disclosure.

Various illustrated embodiments of the disclosure are described in detail as follows, and the detailed descriptions cannot be considered as a limitation to the disclosure, but should be understood as the more detailed descriptions of some certain aspects, features and technical schemes of the disclosure.

It should be understood that the terms described in the disclosure are intended to describe the illustrated embodiments only and are not intended to limit the disclosure. In addition, a range of values in the disclosure should be understood that each intermediate value between the upper value and the lower value of the range is also disclosed. Each smaller range between the value or the intermediate value within the range and any other value or intermediate value within the range is also included in the disclosure. The upper value and the lower value of these smaller ranges can be independently included or excluded from the range.

Unless otherwise indicated, all of technical and scientific terms used herein have the same meaning as commonly understood by those skilled in the related art. Although the disclosure describes only the illustrated method and materials, any method and materials similar or equivalent to those described herein should also be used in the implementation or testing of the disclosure. All of the literatures referred to in the specification of the disclosure are incorporated by reference for the purpose of disclosing and describing the method and/or materials associated with the literatures. In the event of conflict with any incorporated literatures, the contents of the specification of the disclosure shall prevail.

Without departing from the scope or spirit of the disclosure, various improvements and variations are made to the illustrated embodiments of the disclosure, as will be obvious to those skilled in the related art. Other embodiments derived from the specification of the disclosure are obvious to those skilled. The specification and embodiments of the disclosure are exemplary only.

The terms "contains", "includes", "has", "contains", etc. used herein are tolerant terms, namely that these terms mean including but not limited to.

The purchasing source of materials in the embodiments is as follows.

Organic Semiconductor Molecules:

DNTT with a structural formula expressed as follows:

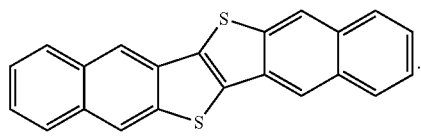 [SMILES: c1ccc2cc3c(cc2c1)sc1c2cc4ccccc4cc2sc31]

Purification of the DNTT: 99%.
Source: Shanghai Daran Chemical Co.
DPA with a structural formula expressed as follows:

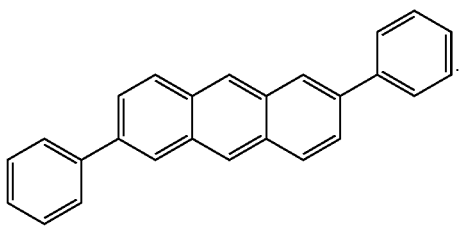 [SMILES: c1ccc(-c2ccc3cc4cc(-c5ccccc5)ccc4cc3c2)cc1]

Purification of the DPA: 99%.
Source: Shanghai Daran Chemical Co.
PTCDA with a structural formula expressed as follows:

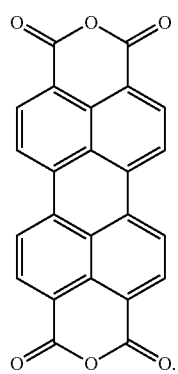 [SMILES: O=C1OC(=O)c2ccc3c4ccc5c6c(ccc(c7ccc1c2c73)c64)C(=O)OC5=O]

Purification of the PTCDA: 99%.
Source: Shanghai Daran Chemical Co.

PTCPI-$CH_2C_3H_7$ with a structural formula expressed as follows:

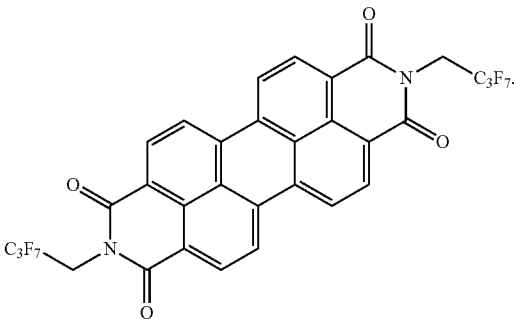

Purification of the PTCPI-$CH_2C_3H_7$: 99%.
Source: Shanghai Daran Chemical Co.
Pentacene with a structural formula expressed as follows:

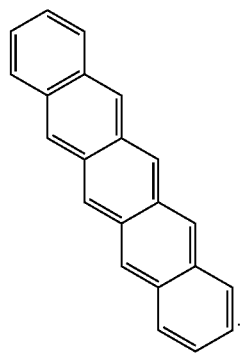 [SMILES: c1ccc2cc3cc4cc5ccccc5cc4cc3cc2c1]

Purification of the pentacene: 99%.
Source: Shanghai Daran Chemical Co.
N1100 with a structural formula expressed as follows:

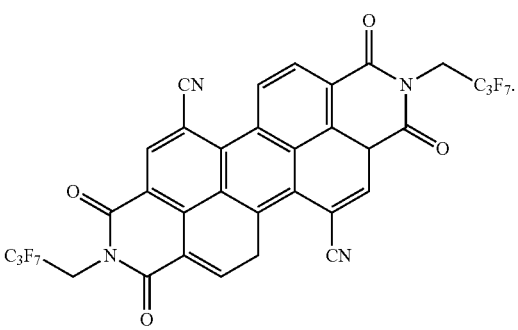

Purification of the N1100: 99%.

N1200 with a structural formula expressed as follows:

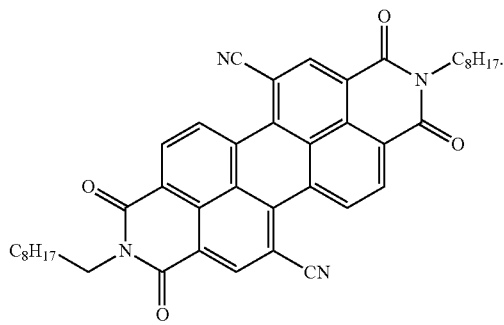

Polymer Semiconductor:

P3HT with a structural formula expressed as follows:

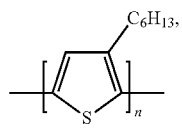

with an average molecular weight being between 40,000 and 100,000; and source: Sigma Aldrich (Shanghai) Trading Co.

N2200 with a structural formula expressed as follows:

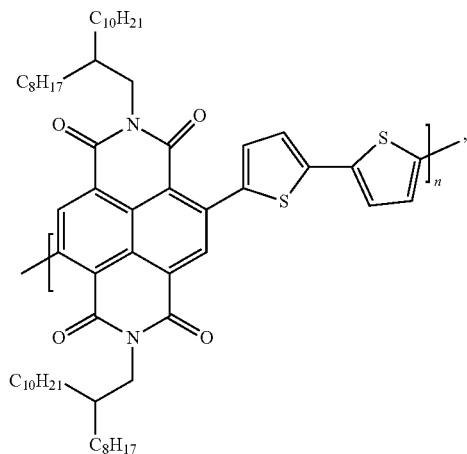

with an average molecular weight being≥30,000.

PBTTT-C14 with a molecular formula as follows:

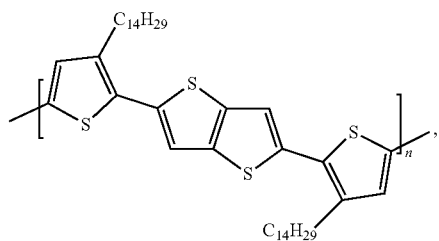

with an average molecular weight being≥20,000.

Nanoparticles:
Metal:
Gold (Au) with a purification of 99.999%;
Silver (Ag) with a purification of 99.999%;
Aluminum (Al) with a purification of 99.999%;
Chromium (Cr) with a purification of 99.999%.
Semiconductor:
Fullerene ($C_{60}$) with a purification of 99%; source: Shanghai Daran Chemical Co.
Insulator:
Molybdenum trioxide ($MoO_3$) with a purification of 99.998%; source: Alfa Aesar (China) Chemical Co.

The schematic diagram of the method for enhancing the stability of the aggregation state of the organic semiconductor film of the disclosure with introducing nanoparticles is shown in FIG. 1.

The disclosure use organic field-effect transistors prepared by the organic semiconductor films with introducing nanoparticles as the illustrated embodiments to quantitatively characterize the stability of electrical properties of the transistors. The other electronic components constructed with the organic semiconductor layer such as organic light-emitting diode (OLED) prepared by the organic semiconductor films with introducing nanoparticles can also bear the higher working temperature and extend the storage life.

Embodiment 1

(1) A silicon wafer containing 300 nanometers (nm) silicon dioxide and 500 micrometers (μm) heavily doped silicon is selected; a size of the silicon wafer is 1 centimeter (cm)×1 cm; the 500 μm heavily doped silicon is used as a gate electrode; octadecyltrichlorosilane (OTS) is modified on the 300 nm silicon dioxide by a vacuum gas phase method at 120° C. for 1 hour to obtain a silicon dioxide insulating layer modified with the OTS.

(2) A metallic source electrode and a metallic drain electrode are metallized on a surface of the silicon dioxide insulating layer modified with the OTS by thermal evaporation; a rate of the thermal evaporation is 0.1 Å/s and thicknesses of the electrodes are 20 nm.

(3) A DNTT film is thermally vaporized on the insulating layer containing the source electrode and the drain electrode; a thickness of the DNTT film is 20 nm and a rate of the thermal evaporation is 0.05 Å/s.

Figure 2A:
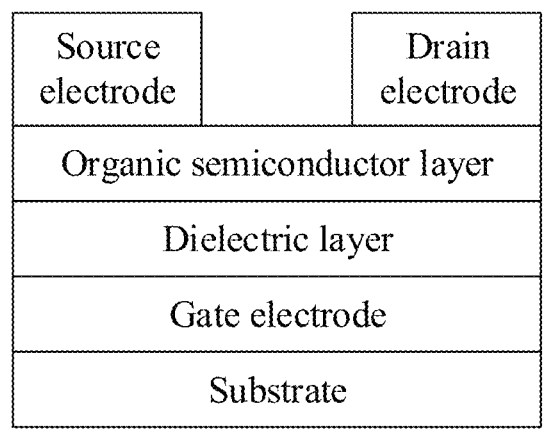
FIGS. 2A-2D show schematic diagrams of organic field-effect transistors according to embodiments of the disclosure.
Figure 2B:
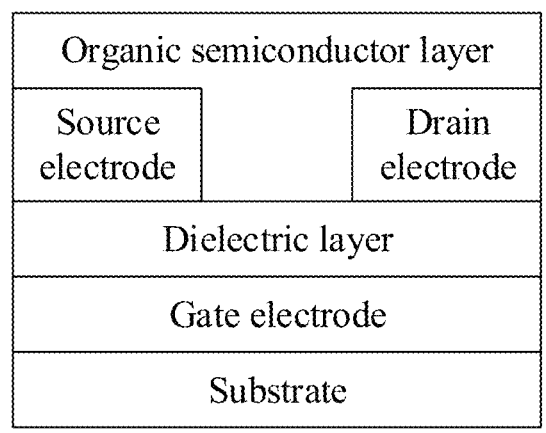
Figure 2C:
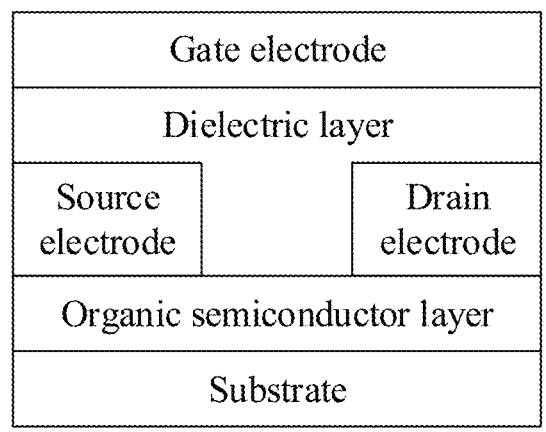
Figure 2D:
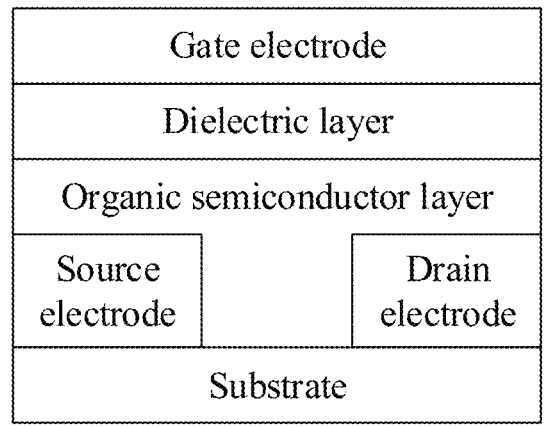

(4) Au nanoparticles are thermally vaporized on a surface of the DNTT film with a rate of 0.05 Å/s for 60 seconds. The DNTT film is doped Au with a volume fraction of 1.5%. During introducing the nanoparticles, a substrate needs to be rotated at a rotation rate of 5 rpm to obtain a bottom-gate bottom-contact organic field-effect transistor (Au-DNTT organic field-effect transistor, as shown in FIG. 2B).

Embodiment 2

(1) A silicon wafer containing 300 nm silicon dioxide and 500 μm heavily doped silicon is selected; a size of the silicon wafer is 1 cm×1 cm; the 500 μm heavily doped silicon is used as a gate electrode; OTS is modified on the 300 nm silicon dioxide by a vacuum gas phase method at 120° C. for 1 hour to obtain a silicon dioxide insulating layer modified with the OTS.

(2) A metallic source electrode and a metallic drain electrode are metallized on a surface of the silicon dioxide insulating layer modified with the OTS by thermal evaporation; a rate of the thermal evaporation is 0.1 Å/s and thicknesses of the electrodes are 20 nm; a DNTT film is thermally vaporized on a substrate with a thickness of 30 nm, while the DNTT film is doped Au with a volume fraction of 2% in a rate of 0.05 Å/s for 120 seconds. During introducing the nanoparticles, the substrate needs to be rotated at a rotation rate of 5 rpm for uniformly bulk phase-doping the film with Au nanoparticles.

(3) A surface of the DNTT film is thermally vaporized the source electrode and the drain electrode to obtain an organic field-effect transistor; thicknesses of the electrodes are 30 nm, and a rate of the thermal evaporation is 0.1 Å/s.

Figure 3A:
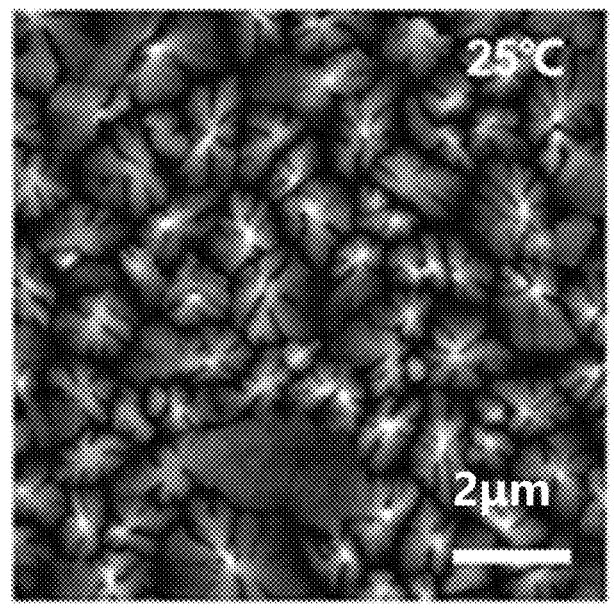
FIGS. 3A-3F show schematic diagrams of morphologies of the organic semiconductor film before and after annealing with a scale of 2 micrometers (μm) according to embodiments of the disclosure.
Figure 3B:
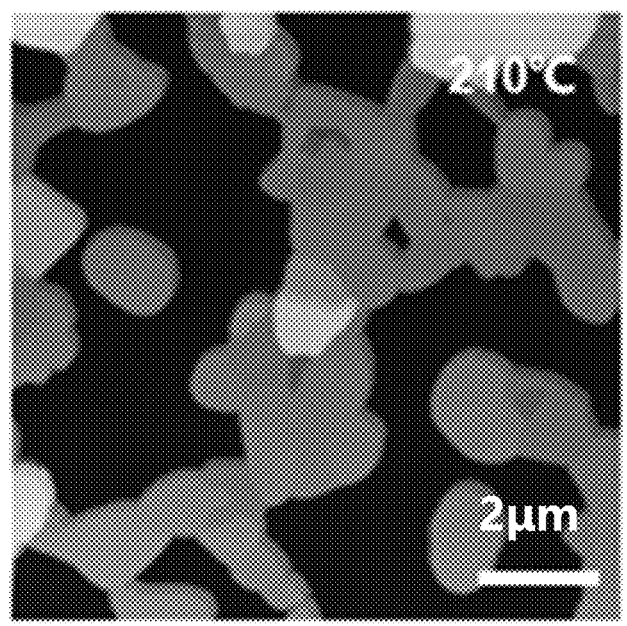
Figure 3C:
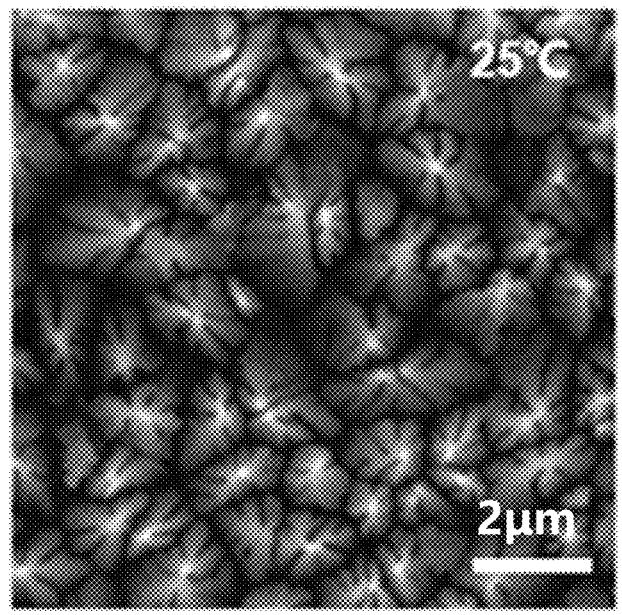
Figure 3D:
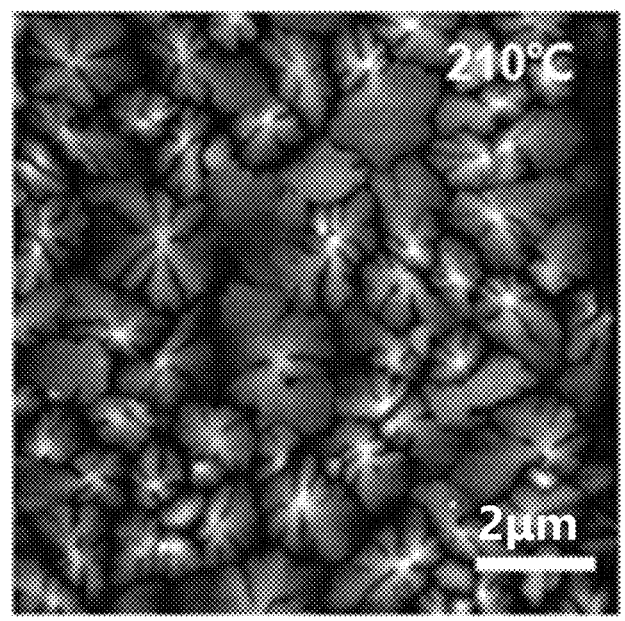
Figure 4:
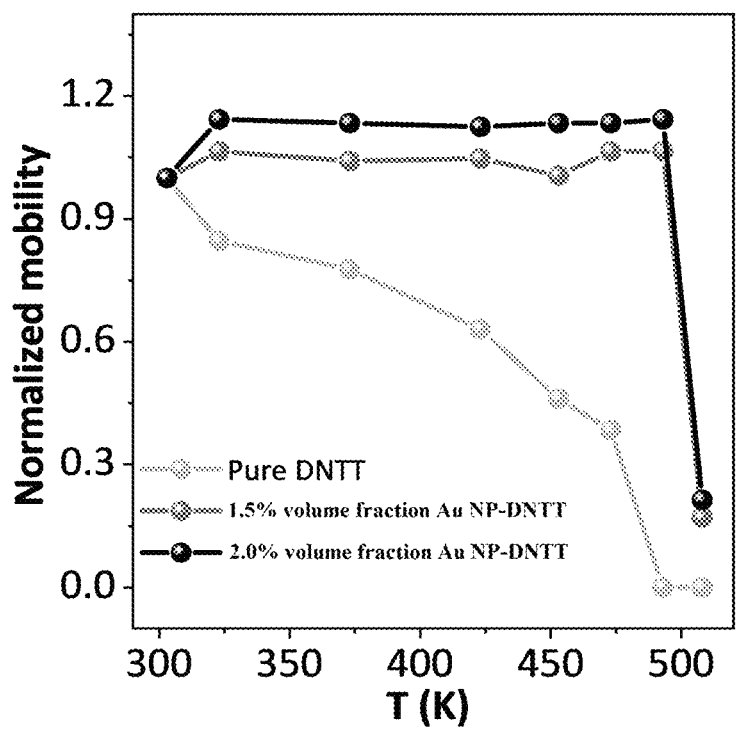
FIG. 4 shows a comparison diagram of normalized motilities of pure DNTT, 1.5% volume fraction of Au NP-DNTT and 2.0% volume fraction of Au NP-DNTT respectively at different temperatures according to the embodiments of the disclosure.
Figure 5:
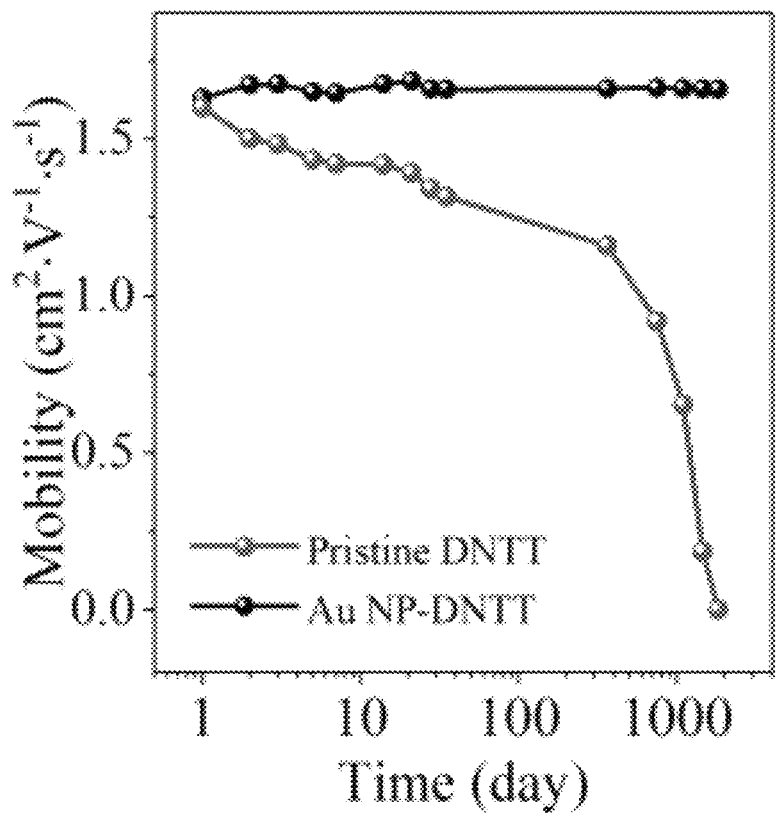
FIG. 5 shows a schematic diagram of a mobility of the organic semiconductor field-effect transistor prepared from pristine DNTT film and a mobility of the organic semiconductor field-effect transistor prepared from the embodiment 1 placed at room temperature for different times according to the embodiments of the disclosure.

In order to verify morphological stability of the organic semiconductor film, the morphology of the DNTT organic field-effect transistor doped with Au nanoparticles (also referred to as the Au-DNTT organic field-effect transistor) is observed by an atomic force microscopy before and after annealing at 210° C. for 30 minutes (as shown in FIGS. 3C-3D). The organic film is a channel part of the prepared transistor. And it is found that the morphology does not change significantly under a condition of annealing at 210° C. for 30 minutes, which means that the aggregation state of the organic film is able to withstand a higher temperature. The electrical properties of the Au-DNTT organic field-effect transistor are further tested, and maximum working temperatures of the Au-DNTT organic field-effect transistors that are doped with the Au nanoparticles in different volume fractions are determined by testing a mobility of the transistors at different temperatures (as shown in FIG. 4). The testing results show that the electrical properties of the organic semiconductor transistors without introducing nanoparticles decrease as the testing temperature increases, while the Au-DNTT transistors doped with the Au nanoparticles in different volume fractions are stable in the high temperature and their electrical properties at the temperatures less than 210° C. are stable, which broadens the working temperature range of the organic transistors. The transistors with introducing nanoparticles and those without introducing nanoparticles are tracked and tested for up to 6 years. The electrical properties are measured to quantitatively characterize their failure extent. The results show that the properties of the organic semiconductor field-effect transistors without introducing nanoparticles decrease gradually at room temperature, and almost completely fail after 6 years, while the electrical properties of the organic semiconductor field-effect transistors with introducing nanoparticles remain stable after 6 years of storage at room temperature (as shown in FIG. 5). The above means that it is difficult to change the morphology of the organic semiconductor film with introducing nanoparticles under normal temperature storage, which ensures the stability of the electrical properties of the organic field-effect transistors prepared by the organic semiconductor film at high temperatures and in the actual environment.

The nanoparticles can be introduced not only to the surface of the organic semiconductor film, but also the bulk phase of the film to stabilize the structure of the film. With specific reference to embodiment 3, the preparation method of the nanoparticles and the organic semiconductor film includes, but is not limited to, thermal evaporation method, atomic layer deposition method, electron beam evaporation method, magnetron sputtering method, hydrogen arc plasma method, laser evaporation method, galvanizing process method, spin-coating method, sol-gel process method, pulling into synchronism method or dripping method.

Embodiment 3

(1) A silicon wafer containing 300 nm silicon dioxide and 500 μm heavily doped silicon is selected; a size of the silicon wafer is 1 cm×1 cm; the 500 μm heavily doped silicon is used as a gate electrode; OTS is modified on the 300 nm silicon dioxide by a vacuum gas phase method at 120° C. for 1 hour to obtain a silicon dioxide insulating layer modified with the OTS.

(2) A metallic source electrode and a metallic drain electrode are metallized on a surface of the silicon dioxide insulating layer modified with the OTS by thermal evaporation; a rate of the thermal evaporation is 0.1 Å/s and thicknesses of the electrodes are 20 nm; a DNTT film is thermally vaporized on a substrate with a thickness of 30 nm, while the DNTT film is doped Au with a volume fraction of 1.5% in a rate of 0.05 Å/s for 60 seconds. During introducing the nanoparticles, the substrate needs to be rotated at a rotation rate of 5 rpm for uniformly bulk phase-doping the film with the Au nanoparticles.

(3) A surface of the DNTT film is thermally vaporized the source electrode and the drain electrode to obtain an organic field-effect transistor; thicknesses of the electrodes are 30 nm and a rate of the thermal evaporation is 0.1 Å/s.

Figure 7A:
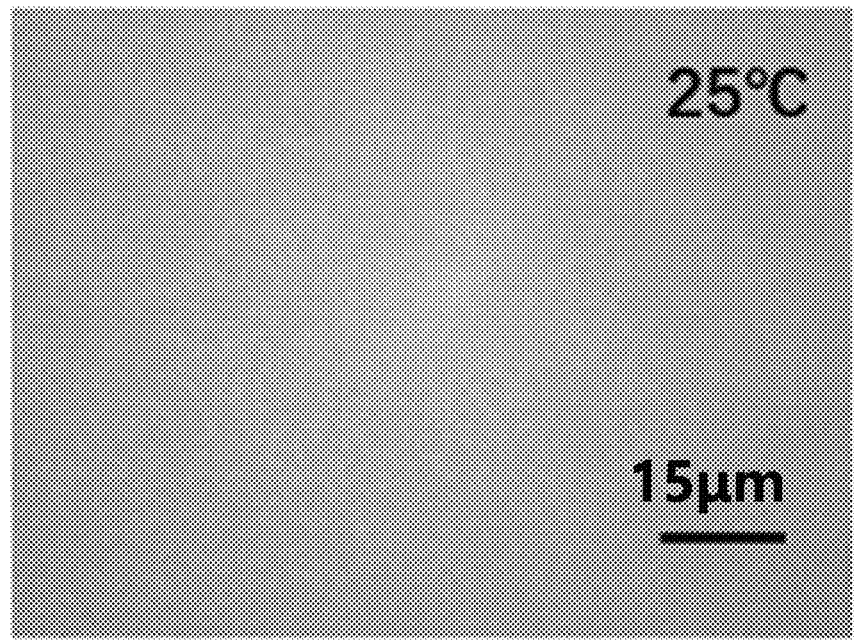
FIGS. 7A-7D show schematic diagrams of morphologies of the organic semiconductor film before and after annealing with a scale of 15 μm according to embodiments of the disclosure.
Figure 7B:
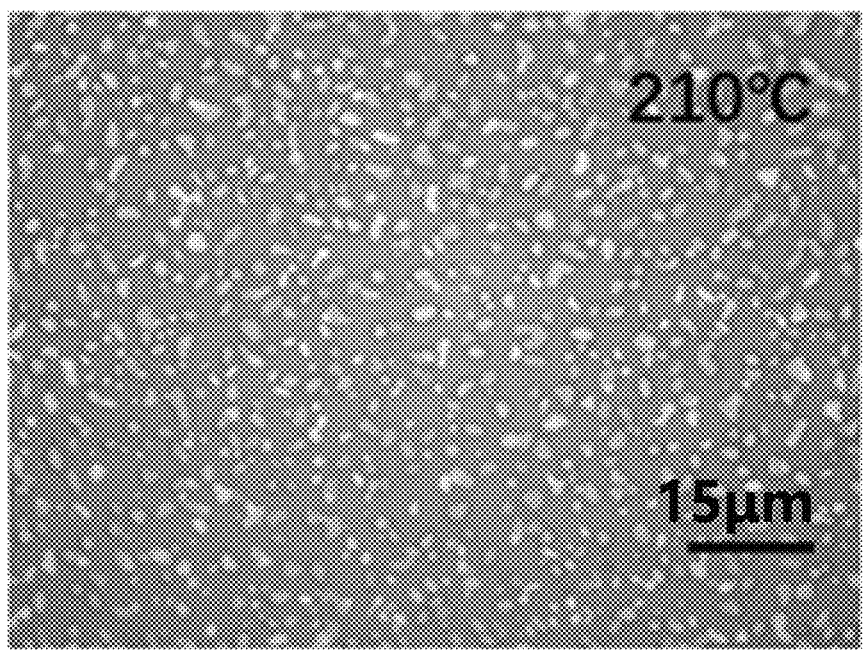
Figure 7C:
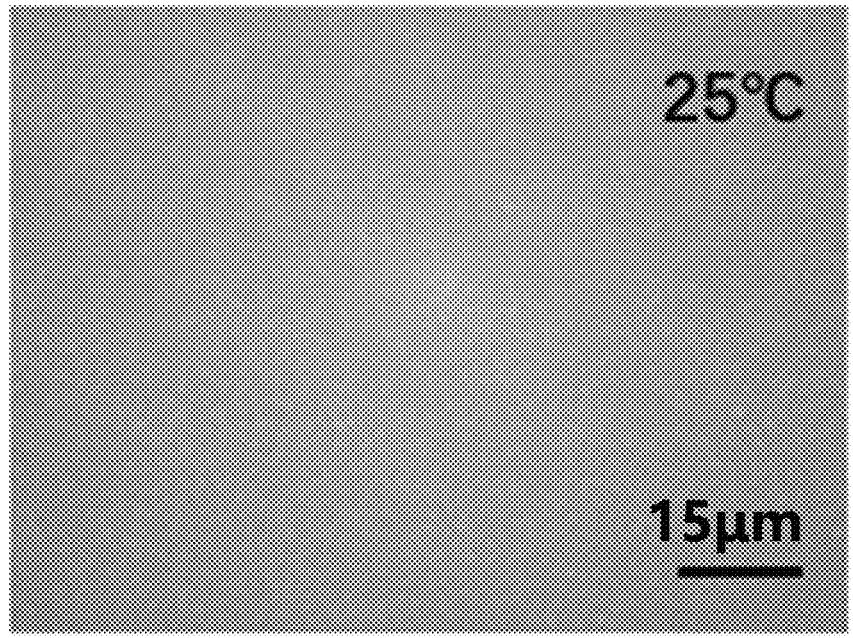
Figure 7D:
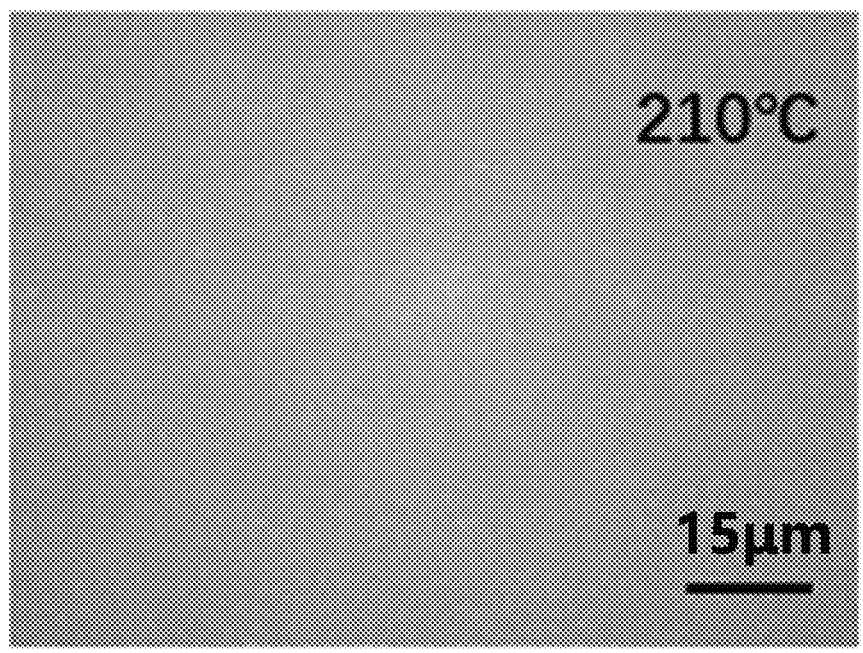

In order to verify morphological stability of the DNTT organic semiconductor film bulk phase-doped with Au nanoparticles, the morphology of the DNTT organic field-effect transistor bulk phase-doped with Au nanoparticles (also referred to as bulk phase Au-DNTT) is observed by the atomic force microscopy before and after annealing at 210° C. for 30 minutes (as shown in FIGS. 7C-7D). And it is found that the morphology does not change significantly under the condition of annealing at 210° C. for 30 minutes, which means that the morphology of the organic film is able to withstand a higher temperature. A comparison embodiment is embodiment 5 (as shown in FIGS. 3A-3B).

Figure 3E:
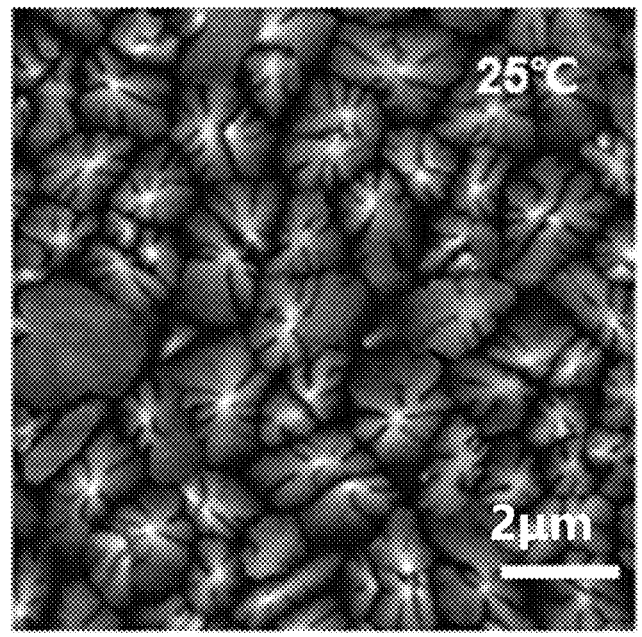
Figure 3F:
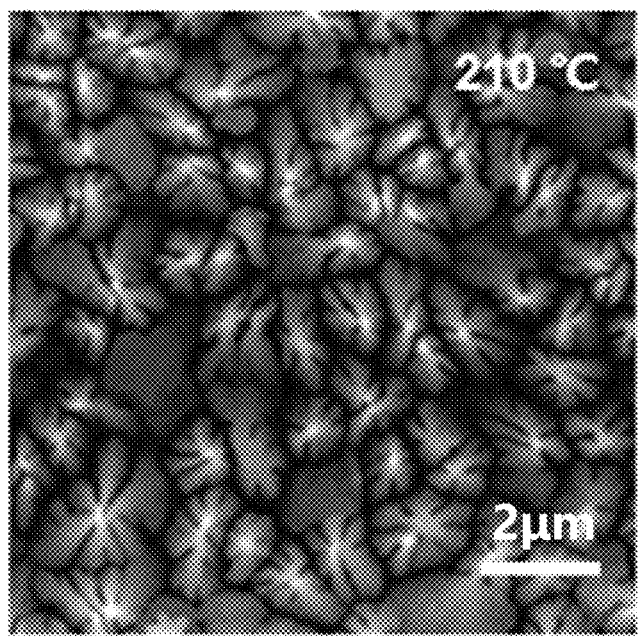

In order to verify morphological stability of the organic semiconductor film, the local morphology of the DNTT organic field-effect transistor is observed by the atomic force microscopy before and after annealing at 210° C. for 30 minutes (as shown in FIGS. 3E-3F). And it is found that the morphology changes significantly under the condition of annealing at 210° C. for 30 minutes, and the continuity of the semiconductor film decreases under the high temperature. In addition, the morphology of the film before and after annealing is further characterized by using a three-dimensional confocal microscopy, and it is found that the film is continuous and homogeneous before and after annealing (as shown in FIGS. 7C-7D). And the structure of aggregation state is very stable, and the semiconductor film with introducing nanoparticles has good thermal stability.

The method of the disclosure can be used not only for the preparation of organic small-molecule semiconductor films, but also for the preparation of organic polymer semiconductor films, which has a significant effect of enhancing the stability of the aggregation state.

Embodiment 4

(1) A silicon wafer containing 300 nm silicon dioxide and 500 μm heavily doped silicon is selected; a size of the silicon wafer is 1 cm×1 cm; the 500 μm heavily doped silicon is used as a gate electrode; OTS is modified on the 300 nm silicon dioxide by a vacuum gas phase method at 120° C. for 1 hour to obtain a silicon dioxide insulating layer modified with the OTS.

(2) A metallic source electrode and a metallic drain electrode are metallized on a surface of the silicon dioxide insulating layer modified with the OTS by thermal evaporation; a rate of the thermal evaporation is 0.1 Å/s and thicknesses of the electrodes are 20 nm.

(3) The insulating layer containing the source electrode and the drain electrode is spin-coated with a polymer of 3-hexylthiophene (P3HT) film; a concentration of the P3HT film is 8 milligrams per millliter (mg/mL), a solvent is toluene; 30 μL P3HT is dropped on the silicon dioxide, a rotating rate of the substrate is 3000 rpm and a rotating time is 50 seconds; and the substrate is heated at 100° C. for 5 minutes to make the excess solvent evaporate to obtain a P3HT polymer film.

(4) A surface of the P3HT polymer film is thermally vaporized at a rate of 0.05 Å/s for 60 seconds; the P3HT polymer film is doped Au with a volume fraction of 1.5%. During introducing the nanoparticles, the substrate needs to be rotated at a rotation rate of 5 rpm to obtain a bottom-gate bottom-contact organic field-effect transistor.

Figure 6A:
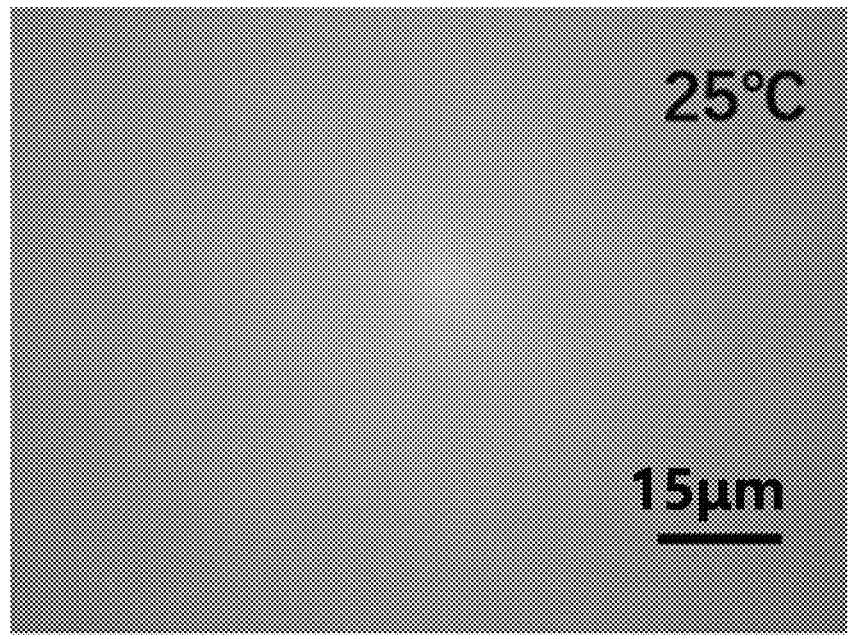
FIGS. 6A-6D show schematic diagrams of morphologies of P3HT film before and after annealing with a scale of 15 μm according to the embodiments of the disclosure.
Figure 6B:
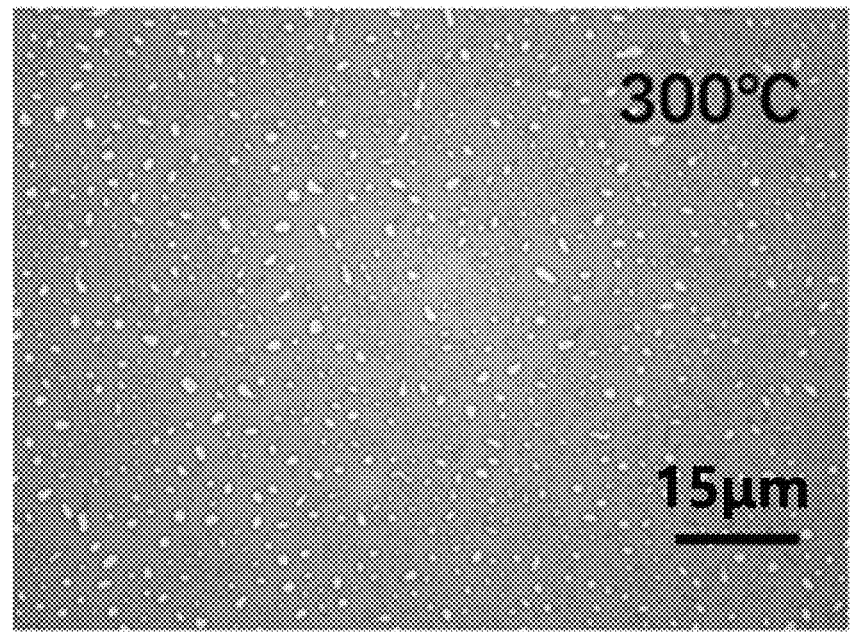
Figure 6C:
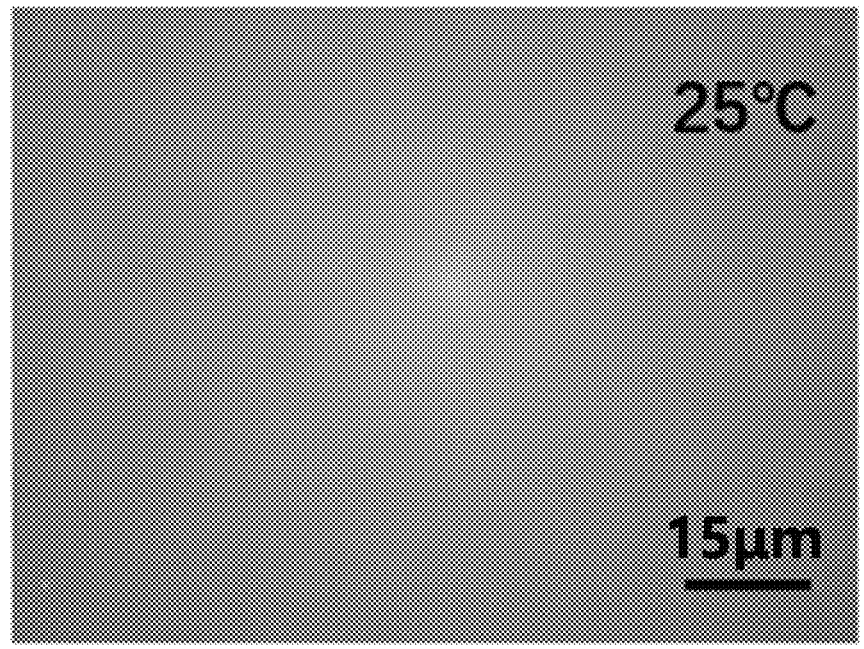
Figure 6D:
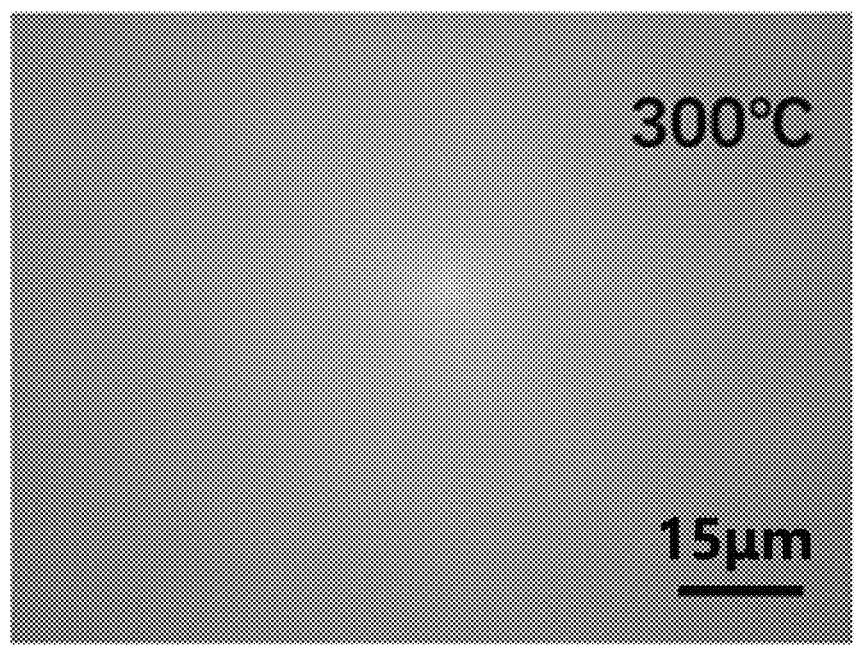

In order to verify morphological stability of the P3HT polymer semiconductor, the morphology of the P3HT organic field-effect transistor doped with Au nanoparticles (also referred to as an Au-P3HT organic field-effect transistor) is observed by the atomic force microscopy before and after annealing at 300° C. for 1 h (as shown in FIGS. 6C-6D). And it is found that the morphology does not change significantly under the condition of annealing at 300° C. for 1 h, which means that the morphology is able to withstand a higher temperature.

To prove that the method of the disclosure has excellent results, the embodiments 5-6 are set up for comparison, as follows.

Embodiment 5

(1) A silicon wafer containing 300 nm silicon dioxide and 500 μm heavily doped silicon is selected; a size of the silicon wafer is 1 cm×1 cm; the 500 μm heavily doped silicon is used as a gate electrode; OTS is modified on the 300 nm silicon dioxide by a vacuum gas phase method at 120° C. for 1 hour to obtain a silicon dioxide insulating layer modified with the OTS.

(2) A metallic source electrode and a metallic drain electrode are metallized on a surface of the silicon dioxide insulating layer modified with the OTS by thermal evaporation; a rate of the thermal evaporation is 0.1 Å/s and thicknesses of the electrodes are 20 nm.

(3) A DNTT film is thermally vaporized on the insulating layer containing the source electrode and the drain electrode; a thickness of the DNTT film is 30 nm and a rate of the thermal evaporation is 0.05 Å/s.

In order to verify morphological stability of the organic semiconductor, the local morphology of the DNTT organic field-effect transistor is observed by the atomic force microscopy at 210° C. before annealing and after annealing for 30 minutes (as shown in FIGS. 3A-3B). And it is found that the morphology changes significantly under the condition of annealing at 210° C. for 30 minutes and a continuity of the semiconductor film decreases under the high temperature. In addition, the three-dimensional confocal microscope is used to further characterize the morphology of the film after annealing, and it is found that the film has a continuous and uniform morphology compared with that before annealing (as shown in FIG. 7A), and the overall film is no longer continuous (as shown in FIG. 7B), which means the aggregation state is unstable. The electrical properties of the DNTT organic field-effect transistor are further tested, and the maximum working temperature of the DNTT organic field-effect transistors is determined by testing the mobility of the transistor at different temperatures, and a high temperature lifetime is characterized by testing lifetime at 150° C. And it is found that under the above two kinds of testing conditions, the mobility shows that the electrical properties are unstable at the high temperatures. According to a ratio between drift values of the threshold voltage and switching ratio change of the embodiment 4 and the embodiment 1, the embodiment 4 is manifested in the drift of threshold voltage and the decrease of switching ratio, while the embodiment 1 shows a stable threshold voltage and switching ratio. FIG. 4 shows the normalized mobility comparison between the embodiment 1 and the embodiment 4. It can be found that the mobility of semiconductor film (in the embodiment 1) with introducing nanoparticles is very stable, while that of the embodiment 4 is decreasing.

Embodiment 6

(1) A silicon wafer containing 300 nm silicon dioxide and 500 μm heavily doped silicon is selected; a size of the silicon wafer is 1 cm×1 cm; the 500 μm heavily doped silicon is used as a gate electrode; OTS is modified on the 300 nm silicon dioxide by a vacuum gas phase method at 120° C. for 1 hour to obtain a silicon dioxide insulating layer modified with the OTS.

(2) A metallic source electrode and a metallic drain electrode are metallized on a surface of the silicon dioxide insulating layer modified with the OTS by thermal evaporation; a rate of the thermal evaporation is 0.1 Å/s and thicknesses of the electrodes are 20 nm.

(3) The insulating layer containing the source electrode and the drain electrode is spin-coated with a P3HT film; a concentration of the P3HT film is 8 mg/mL, a solvent is toluene; 30 μL P3HT is dropped on the silicon dioxide, a rotating rate of the substrate is 3000 rpm and a rotating time is 50 seconds; and the substrate is heated at 100° C. for 5 minutes to make the excess solvent evaporate to obtain a bottom-gate bottom-contact organic field-effect transistor prepared from the P3HT polymer film.

In order to verify morphological stability of the P3HT polymer semiconductor, the morphology of the P3HT organic field-effect transistor doped with Au nanoparticles (also referred to as an Au-P3HT organic field-effect transistor) is observed by the atomic force microscopy before and after annealing at 300° C. for 1 h (as shown in FIG. 6A-6B). And it is found that the organic semiconductor film undergoes dewetting after annealing at 300° C. for 1 h, which is manifested in that the film is no longer uniform, the substrate coverage is reduced, and the continuity is reduced, indicating that the morphology is easy to change at high temperatures.

The embodiments 1-4 of the disclosure shows the organic semiconductor films with high working temperature and long life and the corresponding organic filed effect transistors. And the embodiments 5-6 are for comparison with the embodiments 1-4 of the disclosure. The embodiments 1-4 keep the morphology and electrical properties of the organic field-effect transistors stable under high temperature and continuous thermal stress by introducing the nanoparticles. The morphology and electrical properties of the organic field-effect transistors in the embodiments 5-6 are unstable under the high temperature and continuous thermal stress.

Figure 8:
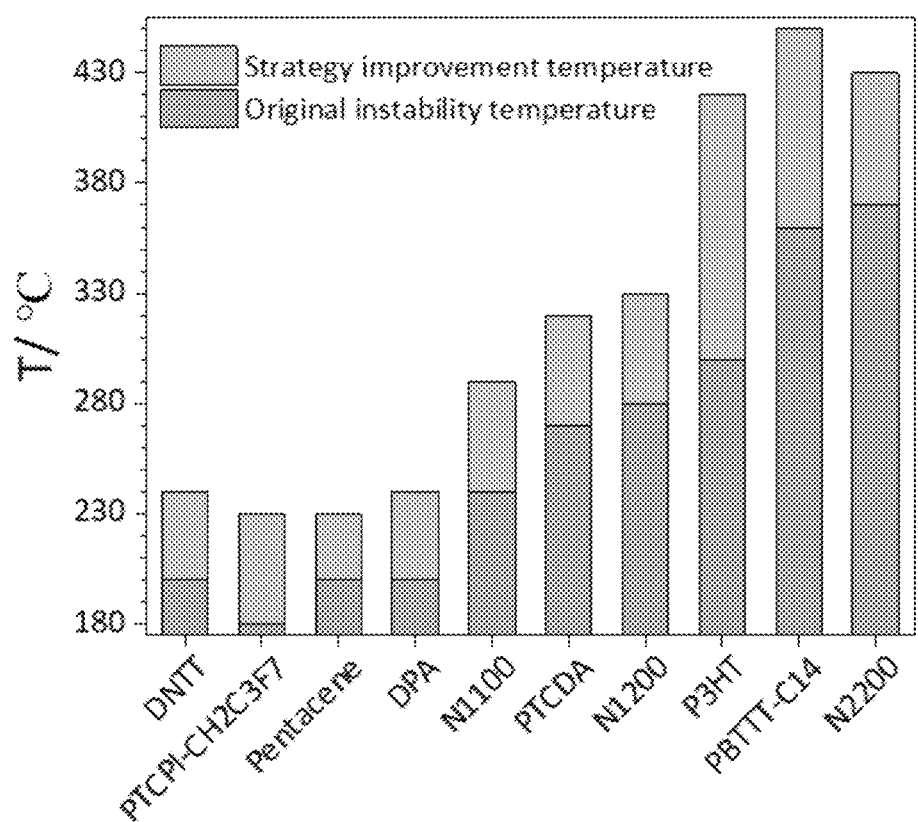
FIG. 8 is a statistical diagram of thermal stability temperature comparison between pristine phase films and Au nanoparticles reinforced dispersion films of different semiconductors.
Figure 9A:
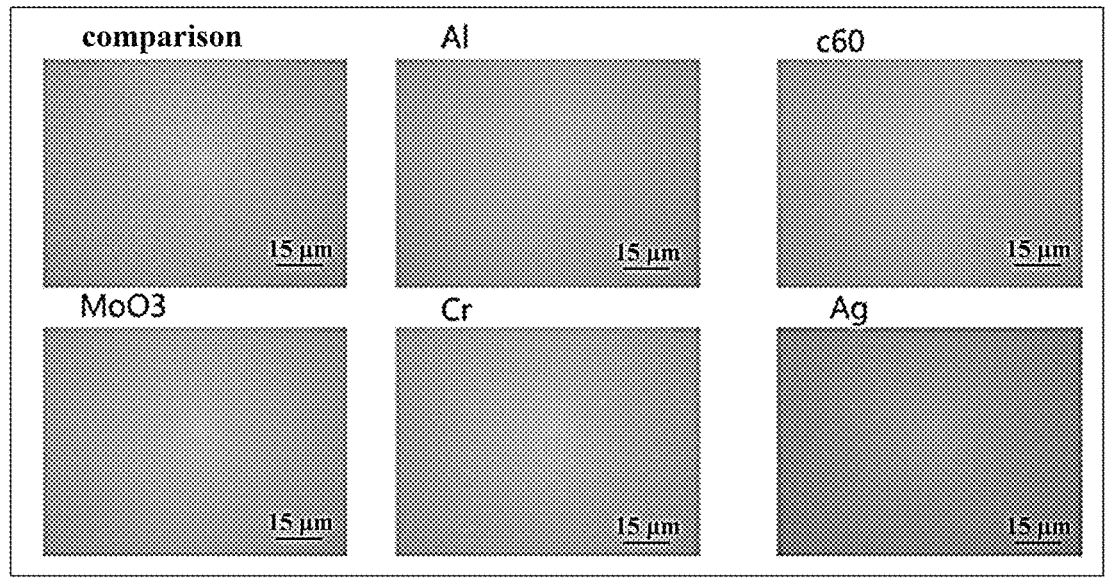
FIGS. 9A-9B show schematic diagrams of morphologies of DNTT organic semiconductor film doped with different nanoparticles before and after annealing with a scale of 15 μm according to embodiments of the disclosure.
Figure 9B:
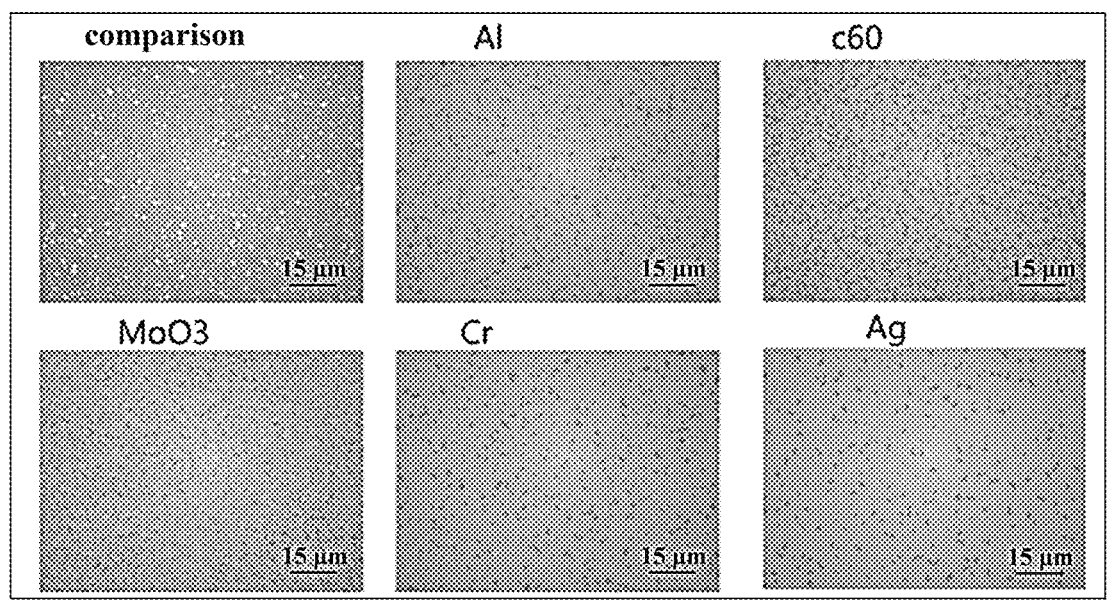

The Au nanoparticles in the DNTT films are replaced with other dispersive phase nanoparticles (such as Ag, Al, Cr, C$_{60}$, MoO$_3$) to verify pervasiveness of the dispersive phase nanoparticles, which is achieved by respectively preparing Ag nanoparticles (NP)-DNTT films, Al NP-DNTT films, Cr NP-DNTT films, C$_{60}$ NP-DNTT films, and MoO$_3$ NP-DNTT films. In addition, pristine DNTT films are prepared to be regarded as the comparison. FIG. 8 shows a statistical diagram of thermal stability temperature comparison between pristine phased films of different semiconductors and Au nanoparticle reinforced dispersion films. The morphological changes of the films before and after annealing at 220° C. are observed by the three-dimensional confocal microscopy (as shown in FIG. 9A-9B). FIG. 9A shows the morphologies at room temperature before annealing, and it can be found that the films are all uniform and continuous. FIG. 9B shows the morphologies after annealing at 220° C., and it is found that the continuity of other films with dispersed nanoparticles is better than that of the pure DNTT film, compared with that the pristine DNTT film is no longer continuous, which proves that the method of the disclosure switching to other dispersion particles is still applicable.

Figure 10A:
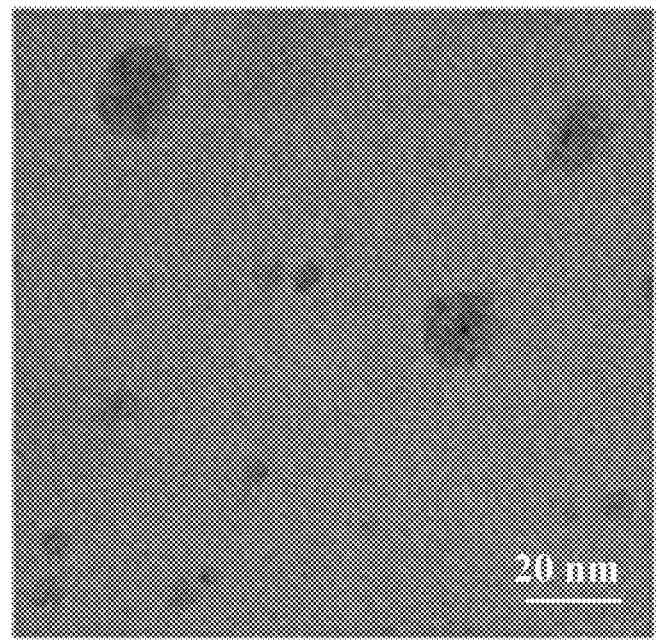
FIGS. 10A-10D are transmission electron micrographs of DNTT organic semiconductor film doped with nanoparticles of different volume fractions with a scale of 20 μm according to embodiments of the disclosure.
Figure 10B:
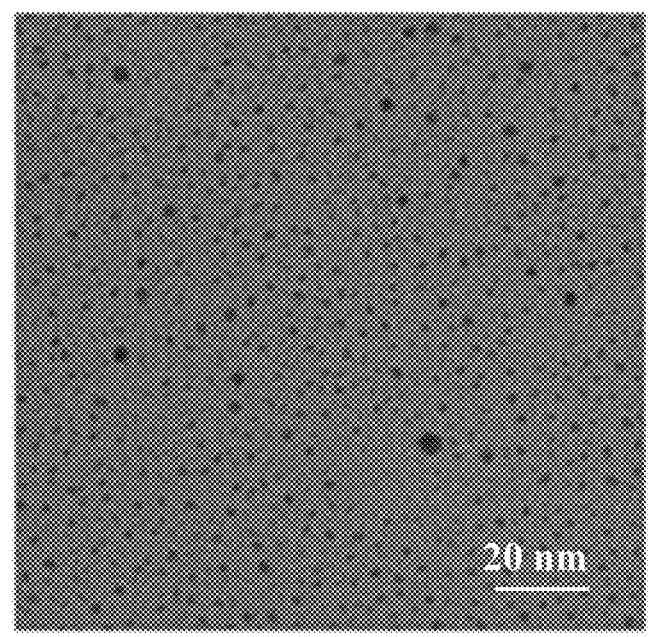
Figure 10C:
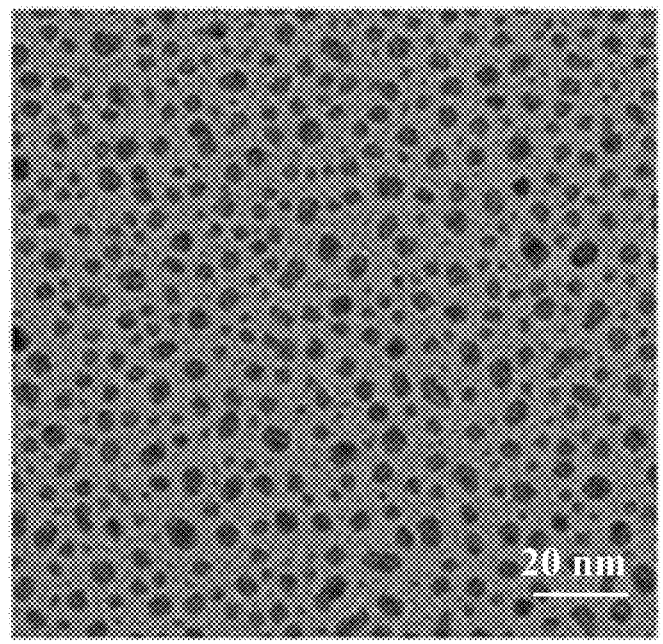
Figure 10D:
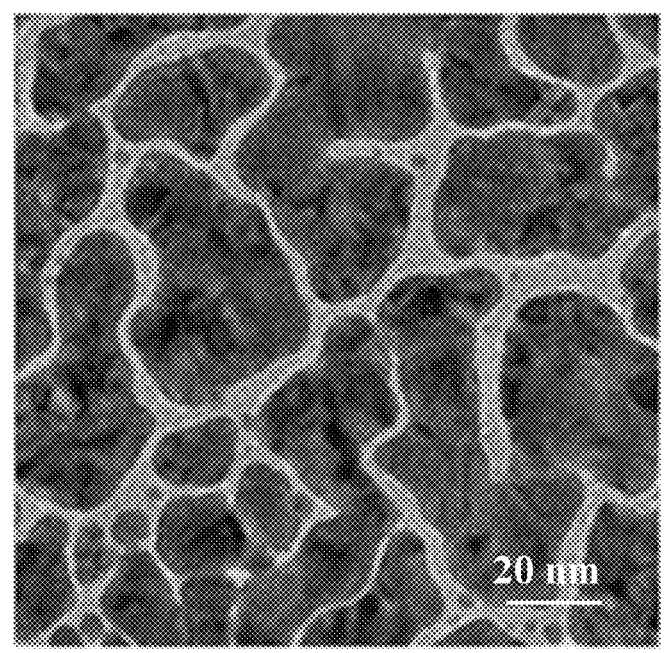

A transmission electron micrograph of the DNTT organic semiconductor film doped with Au nanoparticles in different volume fractions according to the same method as the embodiment 1 are shown in FIGS. 10A-10D, where FIG. 10A shows a volume fraction of 0.1% with a scale of 20 nm; FIG. 10B shows a volume fraction of 0.5% with a scale of 20 nm; FIG. 10C shows a volume fraction of 1.5% with a scale of 20 nm; FIG. 10D shows a volume fraction of 3% with a scale of 20 nm. From FIGS. 10A-10D, it can be seen that different volume fractions will make diameters of the nanoparticles slightly different, but they are still within a scale of nanometer, uniform and discontinuous, and there is no significant difference in working effect. When the volume fraction of the nanoparticles is not less than 3%, the nanoparticles attract each other due to interactions, thus leading to clustering and the uniformity decreases to some extent, so the uniformity of the nanoparticles in the organic films can be enhanced by controlling the volume fraction of the nanoparticles, which also ensures that the nanoparticles will not affect the electrical properties of the organic semiconductor film.

The above described embodiments are only the illustrated embodiments of the disclosure, not a limitation of the scope of the disclosure. Without departing from the spirit of the design of the disclosure, all kinds of deformations and improvements made to the technical schemes of the disclosure by those skilled in the related art shall fall within the scope of the protection determined by the disclosure.

What is claimed is:

1. A method for enhancing stability of aggregation state of an organic semiconductor film, comprising:
constructing the organic semiconductor film on a surface of an insulating substrate; and introducing nanoparticles into one of a surface of the constructed organic semiconductor film and an inside of the constructed organic semiconductor film, wherein the nanoparticles are uniform and discontinuous, and a volume fraction of the nanoparticles is between 0.1% and 3% accounting for a volume of the organic semiconductor film.

2. The method according to claim 1, wherein the method further comprises: preparing a gate conductive electrode.

3. The method according to claim 1, wherein the organic semiconductor film is a polycrystalline film.

4. The method according to claim 3, wherein the organic semiconductor film is one of an organic small-molecule semiconductor and an organic polymer semiconductor.

5. The method according to claim 1, wherein a diameter of each of the nanoparticles is between 0.01 nanometer (nm) and 100 nm.

6. The method according to claim 5, wherein each of the nanoparticles is one of a metal conductor particle, an organic semiconductor particle, an inorganic semiconductor particle and an insulator particle.

7. The method according to claim 1, wherein the method further comprises: preparing a source electrode and a drain electrode by patterning.

* * * * *